United States Patent
Kang et al.

(10) Patent No.: US 9,905,619 B2
(45) Date of Patent: Feb. 27, 2018

(54) DISPLAY DEVICE AND MANUFACTURING METHOD OF THE SAME

(71) Applicant: Samsung Display Co., Ltd., Yongin (KR)

(72) Inventors: Sung Ku Kang, Suwon-si (KR); Sang Wol Lee, Yongin-si (KR); Tae Hoon Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/490,421

(22) Filed: Sep. 18, 2014

(65) Prior Publication Data

US 2015/0325815 A1 Nov. 12, 2015

(30) Foreign Application Priority Data

May 12, 2014 (KR) .................. 10-2014-0056656

(51) Int. Cl.
*H01L 27/32* (2006.01)
*H01L 51/52* (2006.01)
*H01L 51/56* (2006.01)

(52) U.S. Cl.
CPC ........ *H01L 27/323* (2013.01); *H01L 27/3223* (2013.01); *H01L 27/3272* (2013.01); *H01L 51/5281* (2013.01); *H01L 51/5284* (2013.01); *H01L 51/5293* (2013.01); *H01L 51/56* (2013.01); *H01L 2251/5338* (2013.01)

(58) Field of Classification Search
CPC ............. H01L 27/323; H01L 27/3223; H01L 27/3272; H01L 27/3269; H01L 51/5281; H01L 51/5284; H01L 51/5293; H01L 51/56; H01L 2251/5338; G09G 3/32; G06F 3/038

USPC ................. 257/88, 40; 345/82, 204
See application file for complete search history.

(56) References Cited

U.S. PATENT DOCUMENTS 7,368,307 B2 * 5/2008 Cok .................... H01L 51/0096
257/E33.059
7,928,659 B2 4/2011 Mun et al.
2006/0273304 A1 * 12/2006 Cok .................... H01L 51/0096
257/40

(Continued)

FOREIGN PATENT DOCUMENTS

JP 2011-047976 3/2011
JP 2011-082213 4/2011

(Continued)

*Primary Examiner* — Moazzam Hossain
*Assistant Examiner* — Omar Mojaddedi
(74) *Attorney, Agent, or Firm* — H.C. Park & Associates, PLC

(57) ABSTRACT

A display device including: a substrate configured to include a first region and a second region formed at an outer periphery of the first region; an emission layer disposed on the first region and the second region of the substrate; a polarizer disposed on the emission layer; a touch panel disposed on the polarizer; a window disposed on the touch panel; and a light blocking layer covering side surfaces of the polarizer and the touch panel and a top surface of the emission layer disposed on the second region of the substrate. The polarizer and the touch panel cover the first region of the substrate and expose the second region of the substrate.

12 Claims, 10 Drawing Sheets

(56) References Cited

U.S. PATENT DOCUMENTS

| | | | |
|---|---|---|---|
| 2006/0290273 A1* | 12/2006 | Kang | H01L 51/5246 313/504 |
| 2007/0206156 A1* | 9/2007 | Quach | G03B 21/604 353/20 |
| 2012/0181923 A1* | 7/2012 | Cho | H01L 27/323 313/512 |
| 2013/0002572 A1 | 1/2013 | Jin et al. | |
| 2013/0002583 A1 | 1/2013 | Jin et al. | |
| 2014/0045283 A1* | 2/2014 | Hirakata | H01L 51/56 438/22 |
| 2014/0049522 A1* | 2/2014 | Mathew | H05B 33/0896 345/204 |
| 2014/0145150 A1* | 5/2014 | de Jong | H01L 27/3227 257/40 |
| 2014/0285734 A1* | 9/2014 | Lin | G06F 1/1643 349/12 |

FOREIGN PATENT DOCUMENTS

| | | |
|---|---|---|
| KR | 100670338 | 1/2007 |
| KR | 10-2011-0068169 | 6/2011 |
| KR | 10-2013-0007311 | 1/2013 |

\* cited by examiner

DISPLAY DEVICE AND MANUFACTURING METHOD OF THE SAME

CROSS-REFERENCE TO RELATED APPLICATION

This application claims priority from and the benefit of Korean Patent Application No. 10-2014-0056656, filed on May 12, 2014, which is hereby incorporated by reference for all purposes as if fully set forth herein.

BACKGROUND

Field

Exemplary embodiments relate to a display device and a manufacturing method thereof.

Discussion of the Background

Display devices that are currently known include a liquid crystal display (LCD), a plasma display panel (PDP), an organic light emitting diode device (OLED device), a field effect display (FED), an electrophoretic display device, and the like.

Particularly, the OLED device includes two electrodes and an organic emission layer positioned therebetween. An electron injected from one electrode and a hole injected from the other electrode are coupled with each other in the organic emission layer to generate an exciton, and the exciton emits energy to thereby emit light.

Because the OLED device has a self-luminance characteristic and does not require a separate light source unlike the LCD, thickness and weight thereof may be reduced. Further, because the OLED device has high-grade characteristics, such as low power consumption, high luminance, and a high response speed, the OLED device receives attention as a next-generation display device.

Such a display device is formed by laminating a display panel, a polarizer, a resin layer, and a window on a substrate in sequence. The display panel, the polarizer, the resin layer, and the window are accommodated in a supporter to be protected.

However, when light is obliquely transmitted from the outside, a dummy emission layer and the like located at a lower portion of an edge of the window may be exposed to the outside.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device and a manufacturing method thereof capable of preventing exposure of a dummy emission layer and the like formed inside the display device to the outside caused by light transmitted from the outside.

Additional aspects will be set forth in the detailed description which follows, and, in part, will be apparent from the disclosure, or may be learned by practice of the inventive concept.

An exemplary embodiment discloses a display device including: a substrate including a first region and a second region disposed at an outer periphery of the first region; an emission layer disposed on the first region and the second region of the substrate; a polarizer disposed on the emission layer; a touch panel disposed on the polarizer; a window disposed on the touch panel; and a light blocking layer covering side surfaces of the polarizer and the touch panel, and covering a top surface of a portion of the emission layer disposed on the second region of the substrate. The polarizer and the touch panel cover the first region of the substrate and expose the second region of the substrate.

Another exemplary embodiment discloses a display device including: a substrate including a first region and a second region disposed at an outer periphery of the first region such that an end portion thereof faces upwardly; an emission layer disposed on the first region and the second region of the substrate; a polarizer disposed on the emission layer; a touch panel disposed on the polarizer; a window disposed on the touch panel; and a light blocking member occupying a blocking target space defined by facing side surfaces of the polarizer and the touch panel and a top surface of the bent emission layer. The polarizer and the touch panel cover the first region of the substrate and expose the second region of the substrate.

Another exemplary embodiment discloses a manufacturing method of a display device, including: forming an emission layer on a first region and a second region of a substrate, the second region being disposed at an outer periphery of the first region; forming a polarizer on the emission layer to cover the first region of the substrate and expose the second region of the substrate; forming a touch panel on the polarizer; disposing a window on the touch panel; and forming a light blocking layer to cover side surfaces of the polarizer and the touch panel and a top surface of the emission layer formed on the second region of the substrate.

Another exemplary embodiment discloses a manufacturing method of a display device, including: forming an emission layer on a first region and a second region of a substrate, the second region being disposed at an outer periphery of the first region; forming a polarizer on the emission layer to cover the first region of the substrate and expose the second region of the substrate; forming a touch panel on the polarizer; disposing a window on the touch panel; accommodating the substrate, the emission layer, the polarizer, the touch panel, and the window in a supporter while upwardly bending an end portion of the second region of the substrate; and forming a light blocking member in a blocking target space defined by facing side surfaces of the polarizer and the touch panel and a top surface of the bent emission layer.

It is to be understood that both the foregoing general description and the following detailed description are exemplary and explanatory, and are intended to provide further explanation of the inventive concept as claimed.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
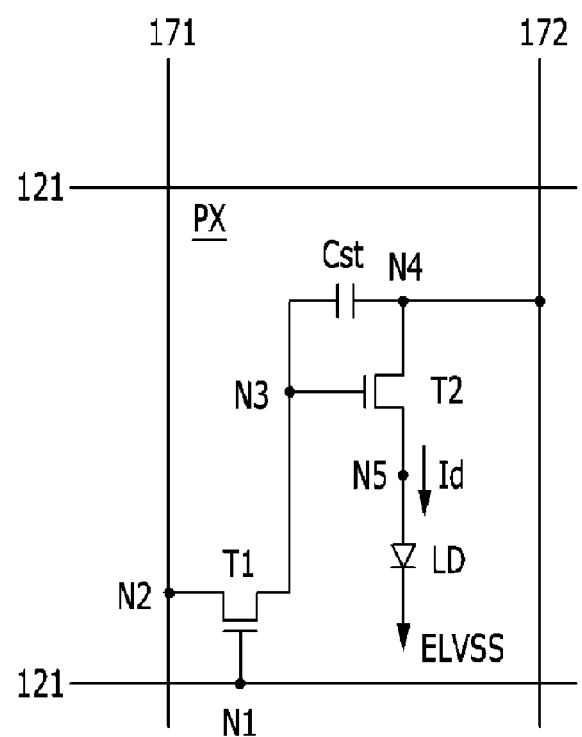
FIG. 1 is an equivalent circuit diagram illustrating one pixel of an organic light emitting diode device.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, suitable structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Referring to FIG. 3 to FIG. 7, in a display device according to an exemplary embodiment, a light blocking layer 500 may be formed on side surfaces of a polarizer 250, a touch panel 260, and a window 270, and on a dummy emission layer 230 to prevent exposure of the inside of the display device to the outside.

First, a display panel configuring a display device according to an exemplary embodiment will be described with reference to FIG. 1 and FIG. 2.

The display device described with reference to FIGS. 1 and 2 relates to an organic light emitting diode (OLED) device. However, the inventive concept may also be applicable to a liquid crystal display (LCD), a plasma display panel (PDP), a field effect display (FED), an electrophoretic display device, and the like.

FIG. 1 is an equivalent circuit diagram illustrating one pixel of an organic light emitting diode device. FIG. 2 is a cross-sectional view illustrating the organic light emitting diode device.

Referring to FIG. 1, the organic light emitting diode device includes signal lines 121, 171, and 172, and a pixel PX connected thereto. The pixel PX may be a red pixel R, a green pixel G, or a blue pixel B.

The signal lines include a scanning signal line 121 transferring a gate signal (or scanning signal), a data line 171 transferring a data signal, and a driving voltage line 172 transferring a driving voltage. The scanning signal lines 121 extend substantially in a row direction and are substantially parallel to each other, and the data lines 171 extend substantially in a column direction and are substantially parallel to each other. The driving voltage lines 172 extend substantially in a column direction, but may extend in a row direction or a column direction or be formed in a net shape.

In this case, one pixel PX includes a thin film transistor including a switching transistor T1 and a driving transistor T2, a storage capacitor Cst, and an organic light emitting element LD. Although not illustrated, one pixel PX may further include a thin film transistor and a capacitor in order to compensate a current provided in the organic light emitting element.

The switching transistor T1 has a control terminal N1, an input terminal N2, and an output terminal N3, and the control terminal N1 is connected to the scanning signal line 121, the input terminal N2 is connected to the data line 171, and the output terminal N3 is connected to the driving transistor T2. The switching transistor T1 transfers the data signal received from the data line 171 to the driving transistor T2 in response to the scanning signal received from the scanning signal line 121.

In addition, the driving transistor T2 has a control terminal N3, an input terminal N4, and an output terminal N5, and the control terminal N3 is connected to the switching transistor T1, the input terminal N4 is connected to the driving voltage line 172, and the output terminal N5 is connected to the organic light emitting element LD. The driving transistor T2 allows an output current Id, of which amplitude varies according to a voltage applied between the control terminal N3 and the output terminal N5, to flow.

In this case, the capacitor Cst is connected between the control terminal N3 and the input terminal N4 of the driving transistor T2. The capacitor Cst charges the data signal applied to the control terminal N3 of the driving transistor T2, and maintains the charged data signal even after the switching transistor T1 is turned off.

Meanwhile, the organic light emitting element LD, for example, as an organic light emitting diode (OLED), has an anode connected to the output terminal N5 of the driving transistor T2 and a cathode connected to a common voltage Vss. The organic light emitting element LD emits light by varying intensities according to the output current Id of the driving transistor T2 to display an image.

The organic light emitting element LD may include an organic material which uniquely expresses any one or one or more of primary colors such as three primary colors of red, green, and blue, and the organic light emitting diode device displays a desired image by a spatial sum of the colors.

The switching transistor T1 and the driving transistor T2 are n-channel field effect transistors (FET), but at least one thereof may be a p-channel field effect transistor. Further, a connection relationship of the transistors T1 and T2, the capacitor Cst, and the organic light emitting diode LD may be changed.

Hereinafter, the organic light emitting diode device will be described with reference to a cross-sectional view illustrated in FIG. 2.

Figure 2:
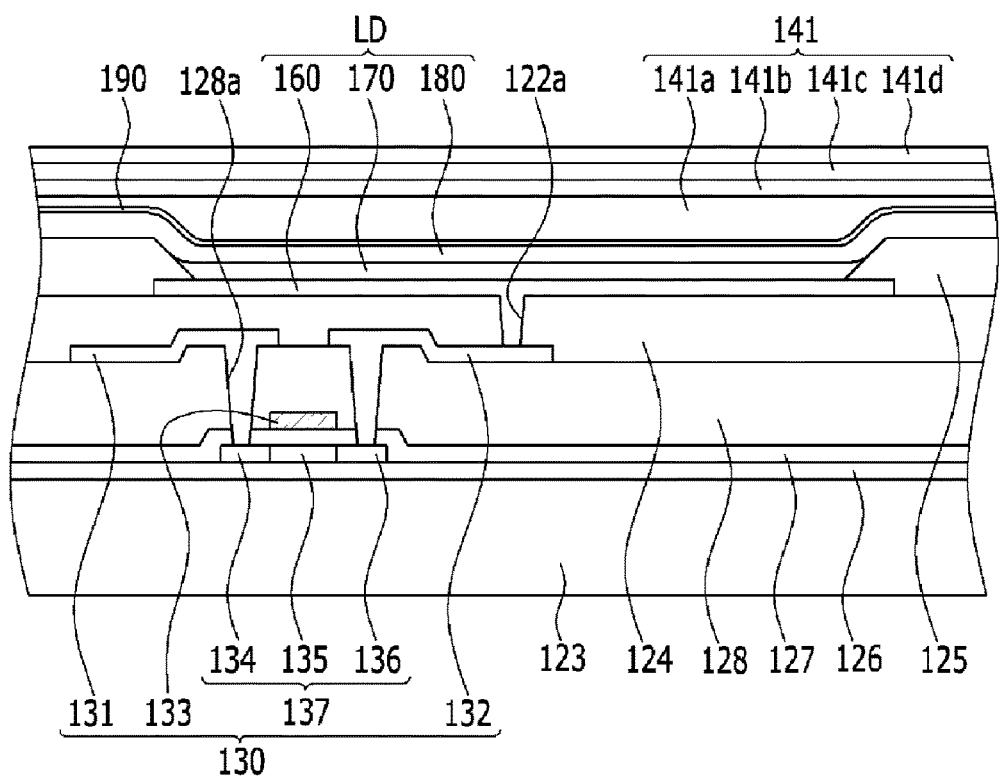
FIG. 2 is a cross-sectional view illustrating the organic light emitting diode device.

Referring to FIG. 2, a substrate 123 is formed as an insulating substrate made of glass, quartz, ceramics, metal, plastic, or the like. The substrate 123 may correspond to a substrate 210 of FIG. 4.

In addition, a substrate buffer layer 126 is formed on the substrate 123. The substrate buffer layer 126 serves to prevent penetration of impure elements and planarize the surface.

In this case, the substrate buffer layer 126 may be made of various materials capable of performing these functions. For example, one of a silicon nitride ($SiN_x$) layer, a silicon oxide ($SiO_x$) layer, and a silicon oxynitride ($SiO_xN_y$) layer may be used as the substrate buffer layer 126. However, the substrate buffer layer 126 is not an essential element, and may be omitted according to the kind of substrate 123 utilized and the process conditions.

A driving semiconductor layer 137 is formed on the substrate buffer layer 126. The driving semiconductor layer 137 is formed as a polysilicon layer. Further, the driving semiconductor layer 137 includes a channel region 135 in which impurities are not doped, and a source region 134 and a drain region 136 in which the impurities are doped at respective sides of the channel region 135. In this case, the doped ion materials may be P-type impurities, such as boron (B), and $B_2H_6$ may be used. The impurities may vary according to the kind of thin film transistor used.

A gate insulating layer 127 made of a silicon nitride (SiNx) or silicon oxide ($SiO_x$) is formed on the driving semiconductor layer 137. A gate wire, including a driving gate electrode 133, is formed on the gate insulating layer 127. In addition, the driving gate electrode 133 is formed to overlap at least a part of the driving semiconductor layer 137, particularly, the channel region 135.

An interlayer insulating layer 128 covering the driving gate electrode 133 is formed on the gate insulating layer 127. Contact holes 128a exposing the source region 134 and the drain region 136 of the driving semiconductor layer 137 are formed in the gate insulating layer 127 and the interlayer insulating layer 128. The interlayer insulating layer 128 may be formed by using a ceramic-based material, such as a silicon nitride ($SiN_x$) or silicon oxide ($SiO_x$), as in the gate insulating layer 127.

In addition, a data wire, including a driving source electrode 131 and a driving drain electrode 132, is formed on the interlayer insulating layer 128. Further, the driving source electrode 131 and the driving drain electrode 132 are connected with the source region 134 and the drain region 136 of the driving semiconductor layer 137 through the contact holes 128a formed in the interlayer insulating layer 128 and the gate insulating layer 127, respectively.

As such, a driving thin film transistor 130, including the driving semiconductor layer 137, the driving gate electrode 133, the driving source electrode 131, and the driving drain electrode 132, is formed. The configuration of the driving thin film transistor 130 is not limited to the aforementioned example, and may be variously modified as a known configuration which may be easily implemented by those skilled in the art.

In addition, a planarization layer 124 covering the data wire is formed on the interlayer insulating layer 128. The planarization layer 124 serves to planarize a step in order to increase emission efficiency of the organic light emitting element to be formed thereon. Further, the planarization layer 124 has an electrode via hole 122a exposing a part of the drain electrode 132.

The planarization layer 124 may be made of one or more materials including a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

The present invention is not limited to the aforementioned structure, and, for example, one of the planarization layer 124 and the interlayer insulating layer 128 may be omitted.

In this case, a first electrode of the organic light emitting element, that is, a pixel electrode 160, is formed on the planarization layer 124. That is, the organic light emitting diode device includes a plurality of pixel electrodes 160 disposed for every plurality of pixels, respectively. In this case, the pixel electrodes 160 are spaced apart from each other. The pixel electrode 160 is connected to the drain electrode 132 through the electrode via hole 122a of the planarization layer 124.

Further, a pixel defining layer 125 having an opening exposing the pixel electrode 160 is formed on the planarization layer 124. That is, the pixel defining layer 125 has a plurality of openings formed for each pixel. In this case, the organic emission layer 170 may be formed for each opening formed by the pixel defining layer 125. Accordingly, a pixel area in which each organic emission layer is formed by the pixel defining layer 125 may be defined.

In this case, the pixel electrode 160 is disposed to correspond to the opening of the pixel defining layer 125. However, the pixel electrode 160 is not necessarily disposed only in the opening of the pixel defining layer 125, but may be disposed below the pixel defining layer 125, such that a part of the pixel electrode 160 overlaps with the pixel defining layer 125.

The pixel defining layer 125 may be made of resin, such as a polyacrylates resin and polyimides, a silica-based inorganic material, or the like.

Meanwhile, an organic emission layer 170 is formed on the pixel electrode 160.

In addition, a second electrode, that is, a common electrode 180, may be formed on the organic emission layer 170. As such, the organic light emitting diode LD, including the pixel electrode 160, the organic emission layer 170, and the common electrode 180, is formed.

In this case, each of the pixel electrode 160 and the common electrode 180 may be made of a transparent, transflective, or reflective conductive material. According to the kind of materials forming the pixel electrode 160 and the common electrode 180, the organic light emitting diode device may be a top emission type, a bottom emission type, or a double-sided emission type.

Meanwhile, an overcoat 190 covering and protecting the common electrode 180 may be formed as an organic layer on the common electrode 180.

In addition, a thin film encapsulation layer 141 is formed on the overcoat 190. The thin film encapsulation layer 141 encapsulates and protects the organic light emitting element LD and a driving circuit part formed on the substrate 123 from the outside.

The thin film encapsulation layer 141 includes organic encapsulation layers 141a and 141c and inorganic encapsulation layers 141b and 141d, which are alternately laminated. In FIG. 2, for example, a case where two organic encapsulation layers 141a and 141c and two inorganic encapsulation layers 141b and 141d are alternately laminated to configure the thin film encapsulation layer 141 is illustrated.

A display device according to a first exemplary embodiment will be described hereinafter with reference to FIG. 3 to FIG. 5.

Figure 5:
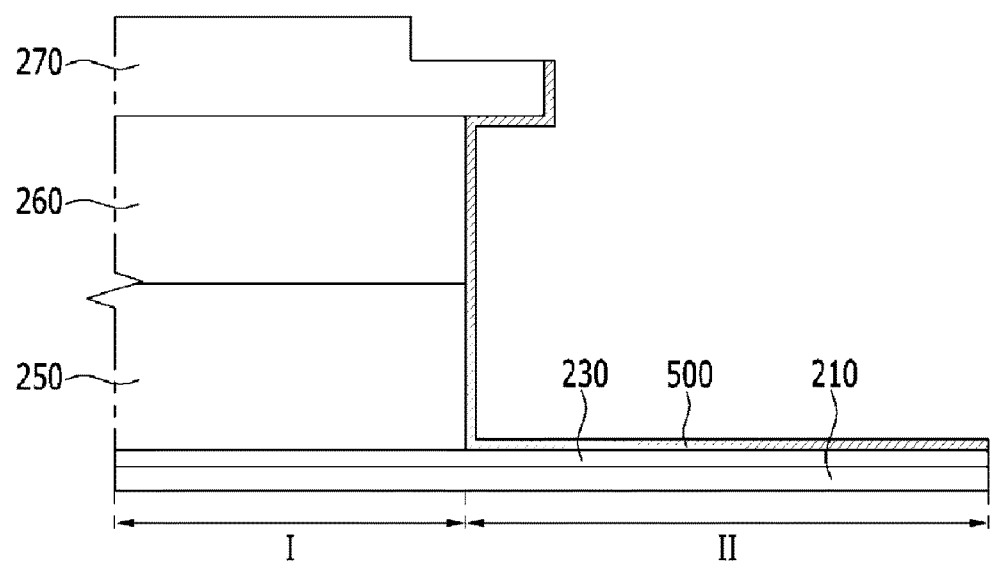
FIG. 5 is a cross-sectional view illustrating the display device before being accommodated in a supporter according to the first exemplary embodiment.

Referring to FIG. 5, the substrate 210 may include a first region I and a second region II. Specifically, referring to FIG. 5, the first region I indicates a central region of the substrate 210, and the second region II indicates a region formed at an outer periphery of the first region I. A dummy emission layer, to be described later, may be formed at the second region II of the substrate 210.

In this case, the substrate 210 may be a flexible substrate. Accordingly, the second region II of the substrate 210 may be bent in a supporter 300, to be described later. As shown in FIG. 4, because the second region II of the substrate 210 is bent, a width occupied by the second region II of the substrate 210 can be reduced.

In this case, the second region II of the substrate 210 may be bent to allow an end portion thereof to face upwardly.

The emission layer 230 may be formed on the substrate 210. The emission layer 230 may be formed on the first region I and the second region II of the substrate 210.

In this case, the emission layer 230 that is formed on the first region I of the substrate 210 may be controlled to emit light by a thin film transistor (not shown) or the like. However, the emission layer 230 that is formed on the second region II of the substrate 210 may be a dummy emission layer.

As a result, the emission layer 230 that is formed on the second region II of the substrate 210 may be formed to be bendable, similar to the substrate 210.

The emission layer 230 may include an organic light emitting element. Because a suitable structure may be applied to the structure of the emission layer 230, a detailed description thereof will be omitted.

A polarizer 250 may be disposed on the emission layer 230. The polarizer 250 is formed on the emission layer 230 to correspond to the first region I of the substrate 210. As a result, the polarizer 250 is disposed above only the first region I of the substrate 210, and not the second region II of the substrate 210.

The polarizer 250 serves to change an optical axis of light emitted to the outside through the emission layer 230. In general, a polarizing plate has a structure in which a transparent protection film is deposited on one or both sides of a polarizer made of a polyvinyl alcohol-based resin.

In detail, the polarizing plate 250 has a structure in which polyvinyl alcohol (PVA)-based molecules chains are arranged in a predetermined direction, and a triacetyl cellulose (TAC) film, serving as the protection film, is adhered to the polarizer including an iodine-based compound or a dichroic polarizer material. In this case, the polarizer and the protection film are adhered by an aqueous adhesive made of a polyvinyl alcohol-based solution.

However, the polarizing plate 250 is not limited the structure thus described, and a polarizing plate using various other structures may be used.

In the meantime, a touch panel 260 may be disposed at an upper portion of the polarizer 250. The touch panel 260 may sense an external touch input. Similar to the polarizer 250, the touch panel 260 is disposed above the first region I of the substrate 210.

In this case, the touch panel 260 may be of a capacitive type. However, the touch panel 260 is not limited thereto. Alternatively, the touch panel 260 may be of a resistive type or an electro-magnetic type.

The window 270 may be disposed above the touch panel 260. The window 270 serves to protect the touch panel 260, the polarizer 250, the emission layer 230, and the like, which are located below the window 270.

As shown in FIG. 5, the window 270 may be formed to be wider than the first region I of the substrate 210.

The light blocking layer 500 may be formed on side surfaces of the polarizer 250 and the touch panel 260.

Figure 8:
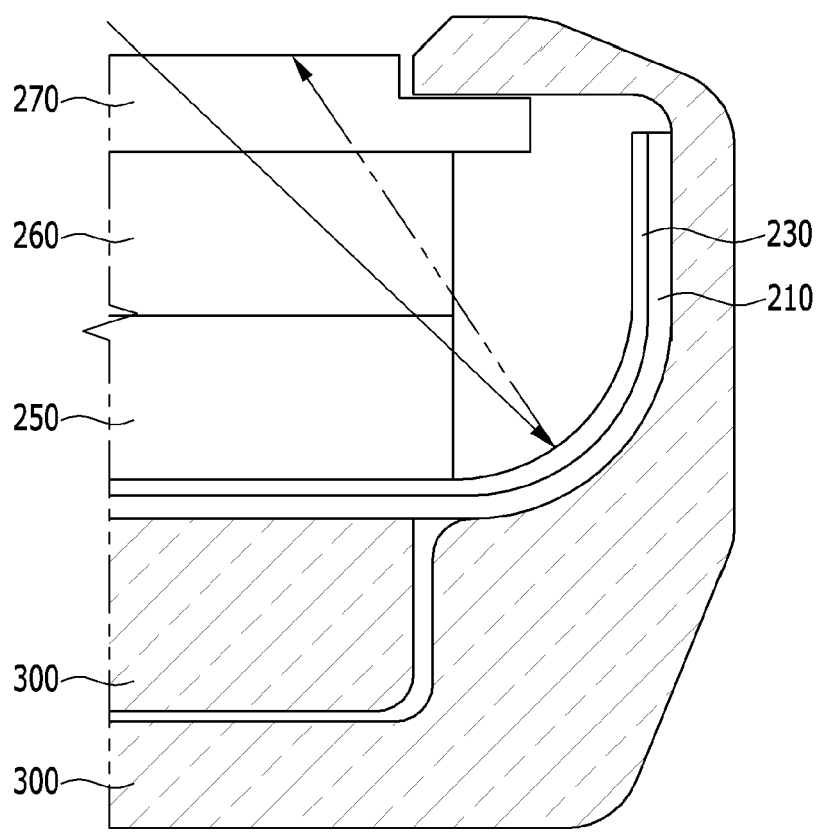
FIG. 8 is a partial cross-sectional view illustrating a display device, an inner portion of which is exposed by light transmitted from the outside.

In this case, the light blocking layer 500 can prevent external light from being obliquely transmitted to the inside of the display device. Referring to FIG. 8, when external light is obliquely transmitted, the second region II of the substrate 210 may be exposed. Specifically, the dummy emission layer 230 formed on the second region II of the substrate 210 may be exposed.

Figure 4:
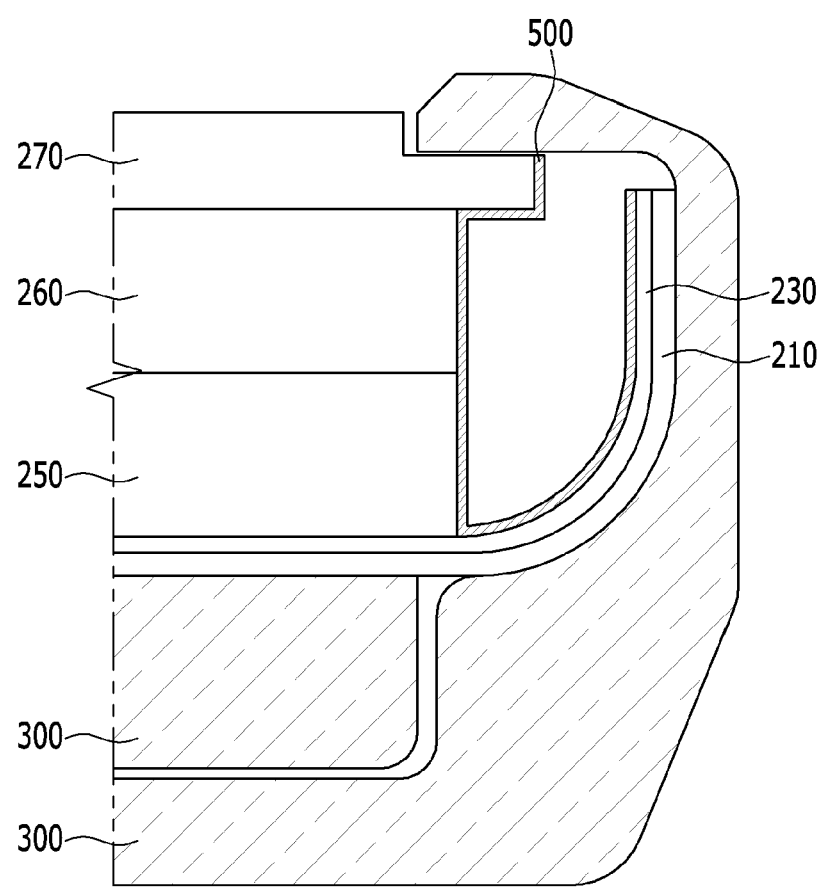
FIG. 4 is a cross-sectional view illustrating the display device taken along a line IV-IV of FIG. 3.

To solve this problem, the light blocking layer 500 may be formed at the side surfaces of the polarizer 250 and the touch panel 260, as shown in FIG. 4.

Further, the light blocking layer 500 may be formed on a top surface of the emission layer 230 formed on the second region II of the substrate 210.

The light blocking layer 500 may cover a side surface of the window 270.

In this case, the light blocking layer 500 may be formed to have a film-like shape. According to the first exemplary embodiment, a light blocking film may be attached to the side surfaces of the polarizer 250, the touch panel 260, and the window 270, and to the top surface of the dummy emission layer 230. In other words, a thin light blocking film may be attached to the side surfaces and the top surface, thereby serving as the light blocking layer 500.

The light blocking layer 500 may be formed of at least one of carbon black, carbon nanotubes, and chromium dioxide ($CrO_2$). The light blocking layer 500 may be formed of a mixture of such a material and a resin.

However, the light blocking layer 500 may instead be formed of other suitable materials.

Referring to FIG. 4, the supporter 300 may accommodate the substrate 210, the emission layer 230, the polarizer 250, the touch panel 260, and the window 270. The supporter 300 may accommodate such constituent elements therein to prevent damage or breakage of the constituent elements.

Figure 3:
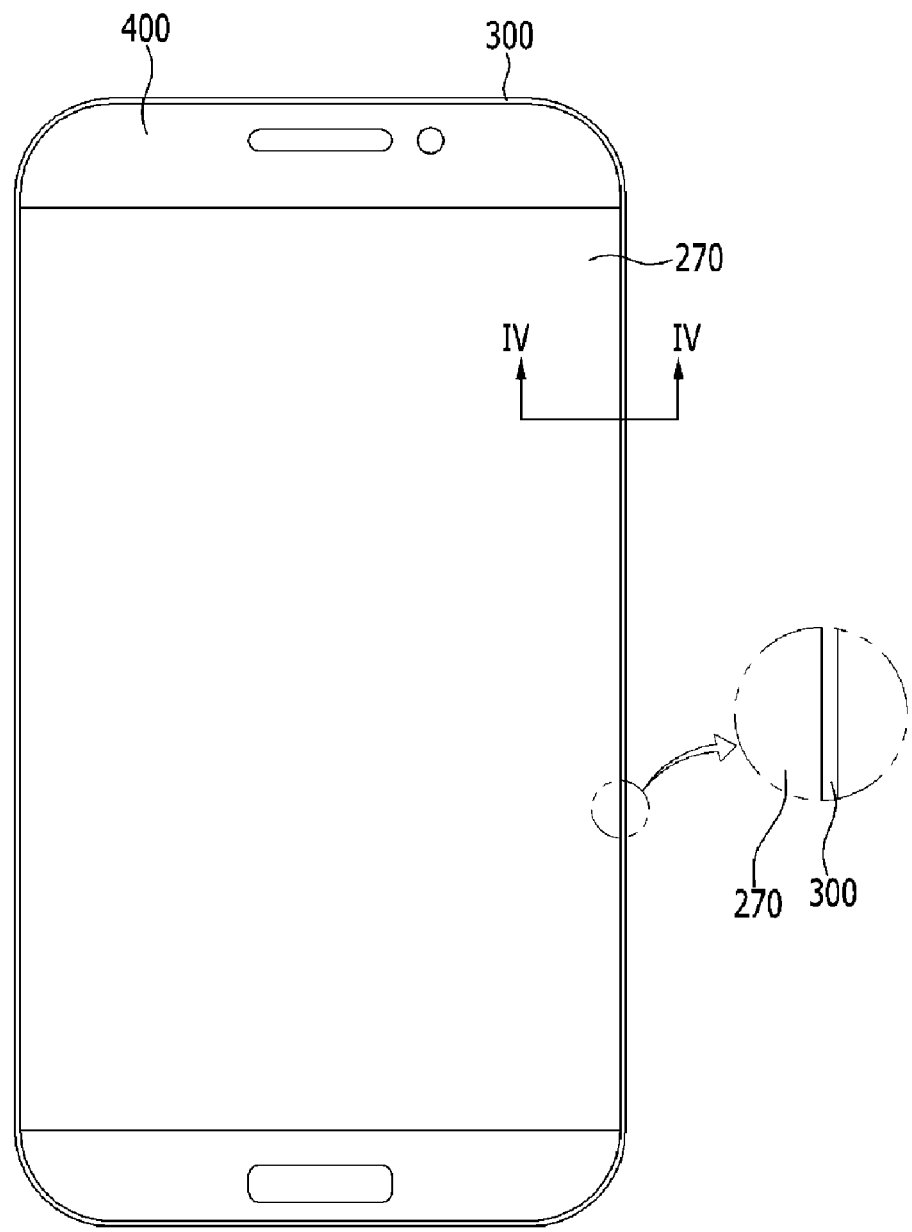
FIG. 3 is a top plan view illustrating a display device according to a first exemplary embodiment.

In the meantime, referring to FIG. 3, the window 270 and an upper part of the supporter 300 may be adhered to each other.

As shown in FIG. 4, a supporting surface that supports the second region II of the substrate 210 is formed in the supporter 300. Specifically, the supporting surface may be formed to have a cross-sectional shape corresponding to the bending shape of the second region II of the substrate 210.

As a result, the second region II of the substrate 210 may be supported by the supporting surface of the supporter 300 such that an end portion of the second region II of the substrate 210 faces upwardly.

In this case, the side surfaces of the polarizer 250 and the touch panel 260 and the bent emission layer 230 may be disposed to face each other.

Hereinafter, a display device according to a second exemplary embodiment will be described, and detailed descriptions of the same or similar constitutions as in the first exemplary embodiment will be omitted.

Figure 6:
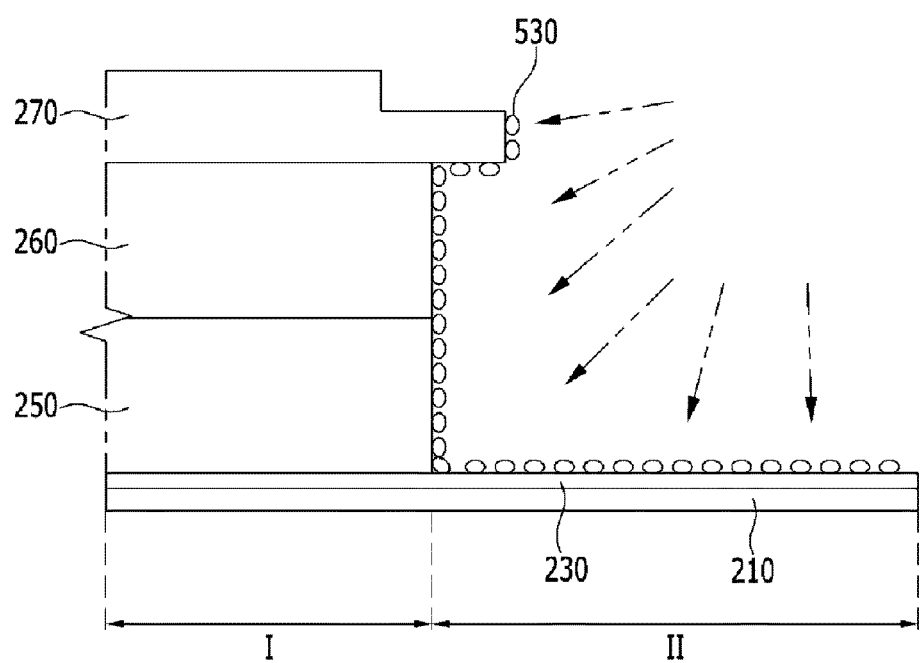
FIG. 6 is a cross-sectional view illustrating a display device before constituent elements are accommodated in a supporter according to a second exemplary embodiment.

According to the second exemplary embodiment, the light blocking layer 500 may be formed by coating a light blocking material 530, as shown, for example, in FIG. 6. The display device according to the second exemplary embodiment is different from the display device according to the first exemplary embodiment in terms of a configuration of the light blocking layer 500.

Specifically, the light blocking layer 500 is formed of a light blocking film according to the first exemplary embodiment, and is formed by coating a light blocking material according to the second exemplary embodiment.

Referring to FIG. 6, the light blocking layer 500 may be formed on side surfaces of the polarizer 250, the touch panel 260, and the window 270, and a top surface of the dummy emission layer 230, by coating a light blocking material 530 thereon. FIG. 6 illustrates a cross-sectional state of the display device before the substrate 210, the dummy emission layer 230, and the like are accommodated in the supporter 300.

Herein, the light blocking material 530 may include at least one of carbon black, carbon nanotubes, and chromium dioxide ($CrO_2$). The light blocking layer 500 may be formed of a mixture of such a material and a resin.

However, the light blocking layer 500 may be formed of other suitable materials without being limited thereto.

Hereinafter, a display device according to a third exemplary embodiment will be described, in which detailed descriptions of the same or similar constitutions as in the first exemplary embodiment will be omitted.

Figure 7:
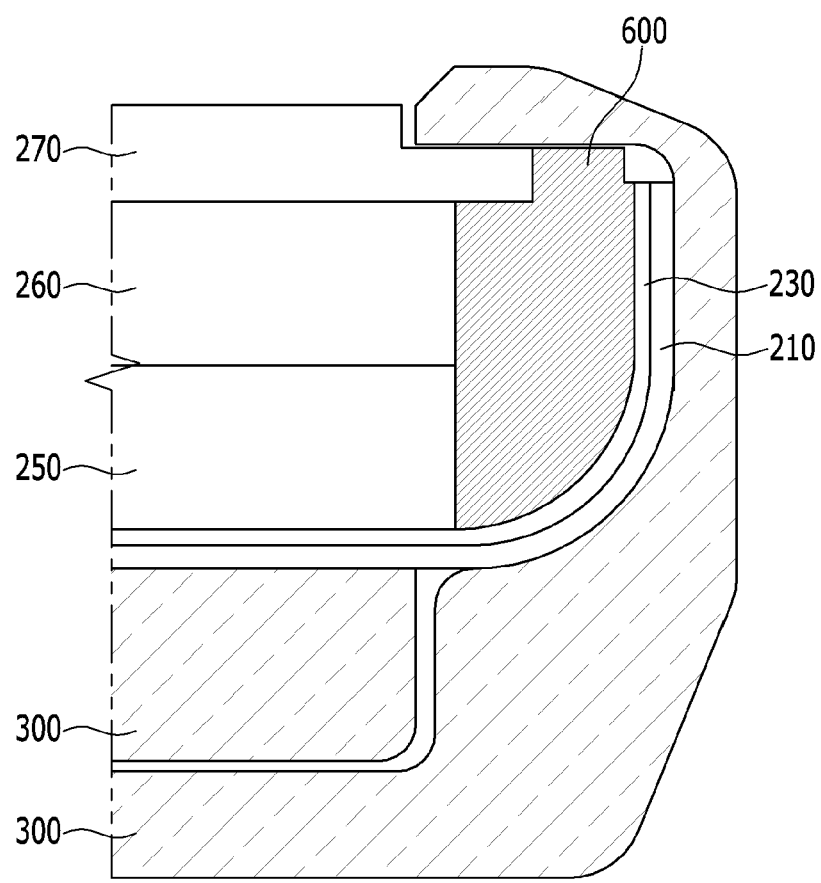
FIG. 7 is a cross-sectional view illustrating a display device according to a third exemplary embodiment.

Referring to FIG. 7, in the display device according to the third exemplary embodiment, a light blocking member 600 is formed at a blocking target space defined by facing side surfaces of the polarizer 250 and the touch panel 260 and the bent emission layer 230. Specifically, the light blocking member 600 is filled in the blocking target space.

The light blocking layer 500 is formed on the side surfaces of the polarizer 250 and the touch panel 260 by coating a light blocking film or material thereon according to the first or second exemplary embodiment, while the light blocking member 600 is filled in the space according to the third exemplary embodiment.

According to the third exemplary embodiment, as shown in FIG. 7, the light blocking member 600 may be a blocking material that is filled in the blocking target space. Herein, the blocking material may include at least one of carbon black, carbon nanotubes, and chromium dioxide ($CrO_2$). The light blocking member 600 may be formed of a mixture of such a material and a resin.

However, the light blocking member 600 may be formed of other suitable materials without being limited thereto.

Hereinafter, a manufacturing method of a display device according to fourth and fifth exemplary embodiments will be described with reference to FIG. 9 and FIG. 10, in which detailed descriptions of the same constitutions as those of the display device will be omitted.

Figure 9:
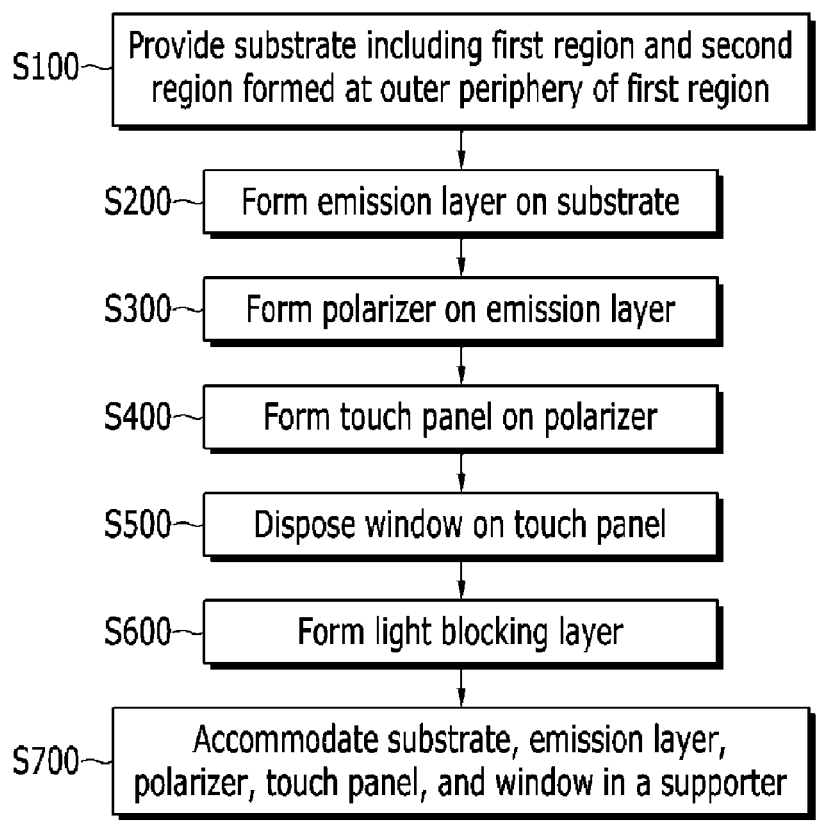
FIG. 9 is a flowchart illustrating a manufacturing method of a display device according to a fourth exemplary embodiment.
Figure 10:
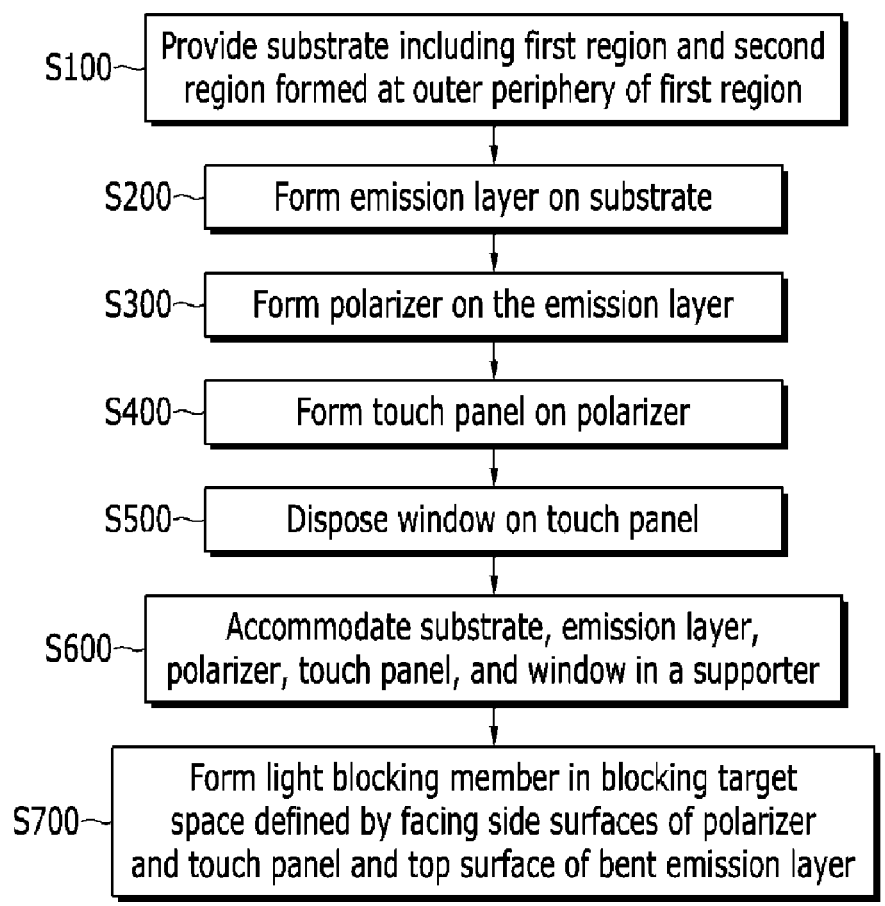
FIG. 10 is a flowchart illustrating a manufacturing method of a display device according to a fourth exemplary embodiment.

Referring to FIG. 9, in accordance with the manufacturing method of the display device according to the fourth exemplary embodiment, the substrate 210 is first provided (S100). The substrate 210 may include a first region I and a second region II. The first region I indicates a central region of the substrate 210, and the second region II indicates a region formed at an outer periphery of the first region I.

In this case, the dummy emission layer 230 is formed on the second region II of the substrate 210, and the second region II is bent such that an end portion thereof faces upwardly. That is, the substrate 210 may be flexible.

Next, the emission layer 230 is formed on the first region I and the second region II of the substrate 210 (S200). In this case, the emission layer 230 that is formed on the first region I of the substrate 210 may be controlled to emit light by a thin film transistor (not shown) or the like. However, the emission layer 230 that is formed on the second region II of the substrate 210 may be a dummy emission layer.

The polarizer 250 is then formed on the emission layer 230 (S300). In this case, the polarizer 250 is disposed above the first region I of the substrate 210.

The touch panel 260 is then formed on the polarizer 250 (S400). The touch panel 260 may sense an external touch input. Similarly to the polarizer 250, the touch panel 260 is disposed above the first region I of the substrate 210.

The window 270 is then formed on the touch panel 260 (S500). The window 270 serves to protect the touch panel 260, the polarizer 250, the emission layer 230, and the like, which are located below the window 270.

The light blocking layer 500 is then formed on side surfaces of the polarizer 250 and the touch panel 260, and a top surface of the emission layer 230 formed on the second region II of the substrate 210 (S600).

In accordance with the manufacturing method of the display device according to the fourth exemplary embodiment, as shown in FIG. 5, the light blocking layer 500 may be formed by attaching a light blocking film on the side surfaces of the polarizer 250 and the touch panel 260, and the top surface of the emission layer 230.

Further, as shown in FIG. 6, the light blocking layer 500 may be formed by coating the light blocking material 530.

The light blocking layer 500 may be formed of at least one of carbon black, carbon nanotube, and chromium dioxide ($CrO_2$). The light blocking layer 500 may be formed of a mixture of such a material and a resin.

However, the light blocking layer 500 may be formed of other suitable materials without being limited thereto.

In this case, in the step in which the light blocking layer 500 is formed, the second region II of the substrate 210 is horizontally maintained without being bent.

Next, the supporter 300 accommodates the substrate 210, the emission layer 230, the polarizer 250, the touch panel 260, and the window 270 therein (S700). A supporting surface that supports the second region II of the substrate 210 is formed in the supporter 300. Specifically, the supporting surface may be formed to have a cross-sectional shape corresponding to a bending shape of the second region II of the substrate 210.

As a result, the second region II of the substrate 210 may be supported by the supporting surface of the supporter 300 such that an end portion of the second region II of the substrate 210 faces upwardly.

Hereinafter, a manufacturing method of a display device according to a fifth exemplary embodiment will be described with reference to FIG. 10. When the manufacturing method of the display device according to the fifth exemplary embodiment is described, detailed descriptions of the same steps as those of the display device according to the fourth exemplary embodiment will be omitted.

First, the substrate 210 is provided (S100). The substrate 210 may include a first region I and a second region II.

The emission layer 230 is then formed on the first region I and the second region II of the substrate 210 (S200).

The polarizer 250 is then formed on the emission layer 230 (S300). In this case, the polarizer 250 is disposed above the first region I of the substrate 210.

The touch panel 260 is then formed on the polarizer 250 (S400).

The window 270 is then formed on the touch panel 260 (S500).

The supporter 300 accommodates the substrate 210, the emission layer 230, the polarizer 250, the touch panel 260, and the window 270 therein (S600). A supporting surface that supports the second region II of the substrate 210 is formed in the supporter 300. Specifically, the supporting surface may be formed to have a cross-sectional shape corresponding to a bending shape of the second region II of the substrate 210.

As a result, the second region II of the substrate 210 may be supported by the supporting surface of the supporter 300 such that an end portion of the second region II of the substrate 210 faces upwardly.

In the fourth exemplary embodiment, the light blocking layer 500 is formed, and then the substrate 210 and other elements are accommodated in the supporter 300. Alternatively, the substrate 210 and other elements may be accommodated in the supporter 300, and then the light blocking member 600 in the fifth exemplary embodiment is formed.

That is, after the supporter 300 accommodates the substrate 210 and other elements, the light blocking member 600 is formed (S700).

The light blocking member 600 is formed at a blocking target space defined by facing side surfaces of the polarizer 250 and the touch panel 260, and the bent emission layer 230. Specifically, the light blocking member 600 is filled in the blocking target space.

In more detail, the light blocking member 600 is formed by injecting a light blocking material into the blocking target space. The light blocking material may be injected into the blocking target space as a liquid.

Herein, the blocking material may include at least one of carbon black, carbon nanotubes, and chromium dioxide ($CrO_2$). The light blocking member 600 may be formed of a mixture of such a material and a resin.

However, the light blocking member 600 may be formed of other suitable materials without being limited thereto.

The light blocking material is then hardened. Herein, the light blocking material may be hardened by irradiation with ultraviolet rays or heat. However, the method of hardening the light blocking material may include various suitable methods of hardening a liquid resin or the like without being limited thereto.

In accordance with a display device and a manufacturing method thereof according to an exemplary embodiment, it is possible to prevent exposure of a dummy emission layer and the like caused by oblique transmission of external light into the display device by forming the light blocking layer 500 or the light blocking member 600 on the side surfaces of the polarizer 250, the touch panel 260, and the window 270.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device comprising:
   a substrate comprising a first region and a second region disposed at an outer periphery of the first region, wherein the first region is flat and the second region is upwardly-curved;
   an emission layer comprising an organic light emitting element, the emission layer comprising a main emission layer disposed on the first region of the substrate and a dummy emission layer disposed on the second region of the substrate, the dummy emission layer comprising an upwardly-curving portion and a flat portion extending in a direction perpendicular to the main emission layer;

a polarizer disposed on the main emission layer;

a touch panel disposed on the polarizer;

a window disposed on the touch panel; and a light blocking layer disposed on and covering side surfaces of the polarizer and the touch panel, and on a top surface of the dummy emission layer, wherein the top surface of the flat portion of the dummy emission layer faces the side surface of the touch panel.

2. The display device of claim 1, wherein the light blocking layer covers a side surface of the window.

3. The display device of claim 1, wherein the light blocking layer comprises a light blocking film.

4. The display device of claim 1, wherein the light blocking layer comprises a coated light blocking material.

5. The display device of claim 1, wherein the light blocking layer comprises at least one of carbon black, carbon nanotubes, and chromium oxide.

6. The display device of claim 1, wherein the second region of the substrate is bent such that an end portion thereof faces upwardly.

7. The display device of claim 1, wherein the substrate is flexible.

8. The display device of claim 1, further comprising a supporter configured to accommodate the substrate, the emission layer, the polarizer, the touch panel, and the window, wherein a supporting surface of the supporter is bent and supports a bent portion of the second region.

9. A display device comprising:

a substrate comprising a first region and a second region disposed at an outer periphery of the first region, wherein the first region is flat and the second region is upwardly-curved;

an emission layer comprising an organic light emitting element, the emission layer comprising a main emission layer disposed on the first region of the substrate and a dummy emission layer disposed on the second region of the substrate, the dummy emission layer comprising an upwardly-curving portion and a flat portion extending in a direction perpendicular to the main emission layer;

a polarizer disposed on the main emission layer;

a touch panel disposed on the polarizer;

a window disposed on the touch panel; and a light blocking member disposed in a space defined by side surfaces of the polarizer and the touch panel, and a top surface of the dummy emission layer, wherein the top surface of the dummy emission layer faces the side surface of the touch panel.

10. The display device of claim 9, further comprising a supporter configured to accommodate the substrate, the emission layer, the polarizer, the touch panel, and the window, wherein a supporting surface of the supporter corresponds to a bending shape of the second region being formed therein so as to support the second region of the substrate.

11. The display device of claim 9, wherein the substrate is flexible.

12. The display device of claim 9, wherein the light blocking layer comprises of at least one of carbon black, carbon nanotubes, and chromium oxide.

* * * * *